(12) United States Patent
Brooks

(10) Patent No.: US 8,089,142 B2
(45) Date of Patent: Jan. 3, 2012

(54) METHODS AND APPARATUS FOR A STACKED-DIE INTERPOSER

(75) Inventor: Michael Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 1892 days.

(21) Appl. No.: 10/075,422

(22) Filed: Feb. 13, 2002

(65) Prior Publication Data
US 2003/0153122 A1    Aug. 14, 2003

(51) Int. Cl.
*H01L 23/02* (2006.01)
(52) U.S. Cl. ......... 257/686; 257/685; 257/777; 257/784
(58) Field of Classification Search ................. 438/109; 257/777, E25.013, 686
See application file for complete search history.

(56) References Cited

U.S. PATENT DOCUMENTS

| | | | | |
|---|---|---|---|---|
| 5,019,946 A * | 5/1991 | Eichelberger et al. | ........ | 361/795 |
| 5,347,159 A * | 9/1994 | Khandros et al. | ............. | 257/692 |
| 5,422,435 A * | 6/1995 | Takiar et al. | ................. | 174/52.4 |
| 5,504,035 A * | 4/1996 | Rostoker et al. | ......... | 228/180.22 |
| 5,677,576 A * | 10/1997 | Akagawa | ..................... | 257/785 |
| 6,277,669 B1 * | 8/2001 | Kung et al. | .................... | 438/106 |
| 6,316,838 B1 * | 11/2001 | Ozawa et al. | ................. | 257/778 |
| 6,376,904 B1 * | 4/2002 | Haba et al. | .................... | 257/686 |
| 6,958,532 B1 * | 10/2005 | Nakayama | ..................... | 257/686 |
| 2001/0020735 A1 * | 9/2001 | Chikawa et al. | ............... | 257/678 |
| 2001/0031508 A1 * | 10/2001 | Danziger et al. | ................ | 438/17 |
| 2002/0024146 A1 * | 2/2002 | Furusawa | ..................... | 257/777 |
| 2002/0027295 A1 * | 3/2002 | Kikuma et al. | ................ | 257/780 |
| 2002/0030263 A1 * | 3/2002 | Akram | .......................... | 257/686 |
| 2002/0121686 A1 * | 9/2002 | Uchida et al. | ................. | 257/686 |
| 2002/0140112 A1 * | 10/2002 | Pon | .................................. | 257/786 |
| 2002/0164838 A1 * | 11/2002 | Moon et al. | .................... | 438/107 |
| 2002/0171136 A1 * | 11/2002 | Hiraoka et al. | ............... | 257/684 |

FOREIGN PATENT DOCUMENTS
JP       358092230 A   *  6/1983
JP       405114693 A   *  5/1993

* cited by examiner

*Primary Examiner* — Angel Roman
(74) *Attorney, Agent, or Firm* — Fletcher Yoder

(57) ABSTRACT

An improved stacked-die package includes an interposer which improves the manufacturability of the package. A semiconductor package includes a package substrate having a plurality of bond pads; a first semiconductor device mounted on the package substrate, the first semiconductor device having a plurality of bond pads provided thereon; an interposer mounted on the first semiconductor device, the interposer having a first interposer bond pad and a second interposer bond pad, wherein the first and second interposer bond pads are electrically coupled; a second semiconductor device mounted on the interposer, the second semiconductor device having a plurality of bond pads provided thereon; a first bond wire connected to one of the plurality of bond pads on said first semiconductor and to the first interposer bond pad; and a second bond wire connected to the second interposer bond pad and to one of the plurality of bond pads on the semiconductor device.

11 Claims, 4 Drawing Sheets

METHODS AND APPARATUS FOR A STACKED-DIE INTERPOSER

TECHNICAL FIELD

The present invention relates, generally, to semiconductor device packaging and, more particularly, to the fabrication of advanced stacked-die semiconductor packages, manufacturability, and the like. In this regard, a major trend in semiconductor packaging is toward low-profile, high-density device packages such as chip-scale and stacked-die packages.

BACKGROUND OF THE INVENTION

Recent advances in semiconductor fabrication techniques have dramatically increased the density and speed of semiconductor devices, leading to a concomitant effort in the field of semiconductor packaging, where increased device density gives rise to many challenges related to electrical connectivity, heat-transfer, manufacturability, and the like. In this regard, a major trend in semiconductor packaging is toward low-profile, high-density device packages such as chip-scale and stacked-die packages.

A typical stacked-die package includes two or more semiconductor devices configured in a stack—one on top of the other—with bond wires leading from bond pads on the first device to bond pads on the second. The bottom-most die in the stack is bonded to a suitable substrate, for example, a ball grid array (BGA) or fine ball grid array (FBGA) substrate, and bond wires are provided between bond-pads on the package substrate to one or more of the die in the stack. The BGA includes an array of solder balls which provide electrical connectivity to external devices. In this way, a relatively dense, low-profile semiconductor package can be manufactured.

Currently known stacked-die packages are unsatisfactory in a number of respects. For example, it is often difficult to properly form the numerous bond wires required between the various semiconductor devices and the package substrate. The complicated topology of wiring between the die and package substrate often results in crossed wires (as seen from a plan view of the die), shallow wire angles (i.e., where the angle between the bond wire and the active-surface of the device is very small), and exceedingly tight bond-pitch.

More particularly, referring to FIG. 1, a typical prior art stacked-die arrangement includes (in part) a bottom semiconductor device 104 mounted on a package substrate 106, and a top semiconductor device 102 mounted on bottom semiconductor device 104. A number of bond pads (e.g., bond pads 108) are provided on top semiconductor device 102 as well as bottom semiconductor device 104 and package substrate 106 (e.g., bond pads 110 and 112 respectively). A plurality of bond wires are formed between semiconductor device 104, semiconductor device 102, and package substrate 106. Due to the number and relatively tight pitch of the bond pads, the placement of bond wires leads to a number of manufacturability problems. As depicted in this drawing, for example, wires leading from bond pads 130 and 132 cross at a point 131 above package substrate 106. Furthermore, wires leading from bond pads 120, 126, and 128 are "interlaced," resulting in difficult bonding targets and leading to wires which are undesirably close together. In addition, as bond wires must be formed from the package substrate 106 to the top-most die on the stack (102), these wires (e.g., wires 136 and 138) are often undesirably long—extending 4.5 mm or more.

Furthermore, to accomodate the complex connectivity in a stacked die package, known methods typically use a package substrate that includes four layers or more, i.e., multiple layers of metal circuitry providing connectivity between bond pads on the package substrate. Such package substrates are costly and time-consuming to design and fabricate.

Other prior art methods which are similarly undesirable include the use of redistribution layers incorporated into on one or more of the semiconductor die themselves, and/or the use of organic package substrates on a leadframe to connect multiple chips lying in a single plane on that leadframe.

Methods are therefore needed in order to overcome these and other limitations of the prior art. Specifically, there is a need for an improved and highly manufacturable stacked-die package.

SUMMARY OF THE INVENTION

The present invention provides systems and methods which overcome the shortcomings of the prior art. In accordance with one aspect, an improved stacked-die package includes an interposer which improves the manufacturability of the package. A semiconductor package in accordance with one embodiment of the present invention includes: a package substrate having a plurality of bond pads; a first semiconductor device mounted on the package substrate, the first semiconductor device having a plurality of bond pads provided thereon; an interposer mounted on the first semiconductor device, the interposer having a first interposer bond pad and a second interposer bond pad, wherein the first and second interposer bond pads are electrically coupled; a second semiconductor device mounted on the interposer, the second semiconductor device having a plurality of bond pads provided thereon; a first bond wire connected to one of the plurality of bond pads on said first semiconductor and to the first interposer bond pad; and a second bond wire connected to the second interposer bond pad and to one of the plurality of bond pads on the semiconductor device.

BRIEF DESCRIPTION OF THE DRAWINGS

The subject invention will hereinafter be described in conjunction with the appended drawing figures, wherein like numerals denote like elements, and.

DETAILED DESCRIPTION OF EXEMPLARY EMBODIMENTS

Figure 1:
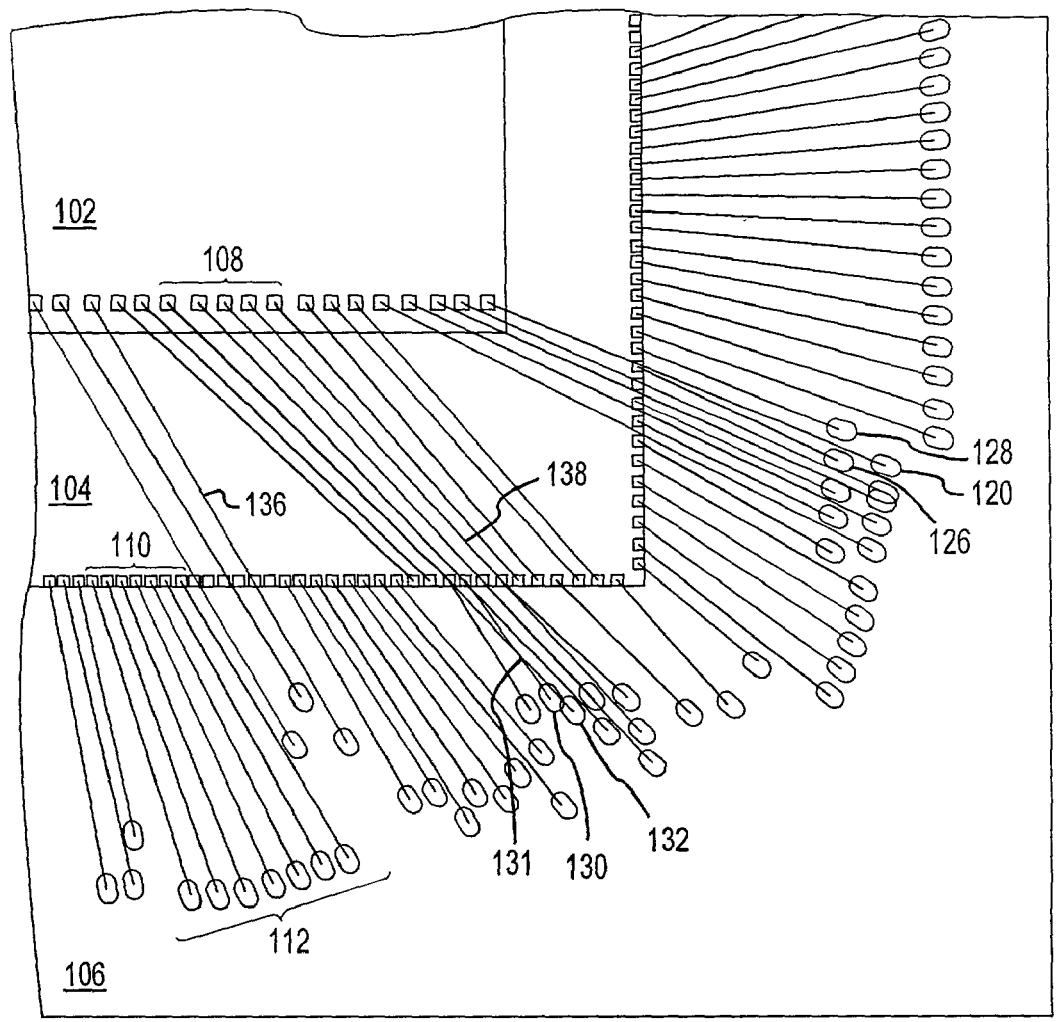
FIG. 1 is a schematic plan view of a typical prior art stacked-die arrangement.

Systems and methods in accordance with various aspects of the present invention provide an improved stacked-die package comprising an interposer which improves the manufacturability of the package. Referring now to the cross-sectional overview shown in FIG. 2, a stacked die package in accordance with one embodiment of the present invention generally includes a first semiconductor device 204 suitably attached to package substrate 202, and a second semiconductor device 208 suitably attached to a silicon interposer 206, which is itself attached to first semiconductor device 204.

Thus, semiconductor device 208, interposer 206, semiconductor device 204, and package substrate 202 collectively form a "stack" held together by die bonds 230, 232, and 234.

A number of bond pads (e.g., bond pad 226) are provided on package substrate 202. Similarly, a plurality of bond pads are provided on first semiconductor device 204, interposer 206, and second semiconductor device 208 (e.g., bond pads 210, 212, and 216 respectively). Bond pads 226 on package substrate 202 are typically coupled to external leads, pins, solder balls, or the like (not shown) thereby providing electrical connectivity to external components, power sources, etc. Bond pads 210 and bond pads 216 provide connectivity to the various semiconductor devices (not shown) formed on and/or within semiconductor devices 204 and 208.

In accordance with one aspect of the present invention, two or more of the bond pads on silicon interposer 206 are electrically coupled via a pattern of conductive traces. For example, with continued reference to FIG. 2, bond pads 212 and 214 are electrically coupled via a conductive trace 213. Accordingly, wire bonds can be advantageously formed to obviate many of the manufacturing problems discussed briefly above. For example, rather than forming a single long wire bond from bond pad 210 to bond pad 216, a bond wire 220 is connected to bond pads 210 and 212, and another bond wire 222 is connected to bond pads 216 and 214. As discussed in further detail below, the pattern of conductive traces (e.g., 213) may be configured to reduce or eliminate the occurrence of crossed wires and/or interlaced bond pads. Having thus given an overview the present invention, a detailed description of its various components will now be provided.

Semiconductor devices 204 and 208 may be fabricated using any suitable semiconductor material upon which or within which electronic components may be formed. Suitable materials for devices 204 and 208 include, for example, group IV semiconductors (i.e., Si, Ge, and SiGe), group III-V semiconductors (i.e., GaAs, InAs, and AlGaAs), and other less-conventional materials, such as SiC, diamond, and sapphire. Devices 204 and 208 may comprise single crystal material, a silicon-on-insulator material (SOI), or one or more polycrystalline or amorphous epitaxial layers formed on a suitable base material. It will be appreciated that devices 204 and 208 will also include various electronic components incorporated into the semiconductor material as well as interconnect structures consisting of conductive paths and various dielectrics for isolating these conductive paths. Such electronic components and processing methods are well known and therefore will not be discussed in detail herein. In this regard, it will be appreciated that the present invention is not limited to a particular class of electronic components. That is, semiconductor devices 204 and 208 may include any combination of digital and/or analog semiconductor devices, including, for example, microprocessors, microcontrollers, application specific integrated circuits (ASICs) static or dynamic memory devices, integrated optic devices, integrated sensors, and field-effect transistor power semiconductors. In one embodiment, for example, semiconductor device 204 comprises an ASIC device and semiconductor device 208 comprises a flash memory device.

Package substrate 202 provides an area to which semiconductor device 204 may be mounted, and also provides electrical connectivity to any external power sources and components. In this regard, package substrate 202 will typically constitute just one part of the entire semiconductor package. The present invention may therefore be used in connection with a wide variety of packages, e.g. ball-grid arrays (BGAs), chip-scale packages (CSPs) thin quad flat-packs (TQFPs), thin small outline packages (TSOPs), and any other package which includes a package substrate.

Depending upon the application, package substrate 202 may include rigid board materials (e.g., FR-4 and BT), ceramics, polyimide flex circuits, metallic leadframes or any other suitable material. In one embodiment, package substrate 202 comprises a BGA substrate fabricated using a glass-filled resin, a polyimide glass, or a cyanate-glass material. Package substrate 202 may also include a pattern of conductors between the various bond pads 226, and might therefore include a multilevel metallization scheme which accommodates the conductor/bond pad topology. In accordance with one embodiment of the present invention, package substrate 202 comprises two-layers of conductive traces.

Die bonds 234, 232, and 230 provide a mechanical and thermal connection between semiconductor devices 208 and 204, interposer 206, and package substrate 202. In this regard, a number of generally available die bond methods may be used. In one embodiment, for example, one or more of the die bonds comprises an epoxy paste dispensed in accordance with known methods. In one embodiment, one or more of the die bonds is formed using QMI 536 Teflon adhesive manufactured by Dexter Electronic Materials of Rocky Hill, Conn. The specification sheet for this material is available from the manufacturer, and is hereby incorporated by reference.

In another embodiment, a pressure-sensitive adhesive tape is used for one or more of the die bonds, e.g., any of the various pressure sensitive tapes manufactured by Lintec Corporation of Tokyo, Japan. Depending upon the nature of the paste or tape used, an appropriate curing step may be performed.

Bond wires 224, 222, and 220 are formed to provide electrical connectivity between the various bond pads. The bond wires may be formed using a variety of materials and any convenient bonding techniques, e.g., thermal-compression bonding. Suitable bond wire materials include, for example, gold, gold—beryllium, aluminum, and aluminum alloys (e.g., Al—Mg—Si, Al—Si, Al—Mg, Al—Cu). The diameter of the wires may range from about 15 microns to about 75 microns. Addition information regarding bond wires, wire-bonding, and a number of other basic packaging techniques may be found in a number of standard texts, e.g., Seraphim, Lasky, and Li, PRINCIPLES OF ELECTRONIC PACKAGING (1989).

Bond pads 216, 212, 210, and 220 provide a predefined area—typically an exposed area of a conductor such as aluminum or copper—to which wire bonds may be secured to provide electrical connectivity with the appropriate semiconductor components, vias, metal-traces, etc. formed on the semiconductor devices, interposer, and package substrate. Such bond pads are well known in the art, and will not be discussed in detail herein.

Figure 3:
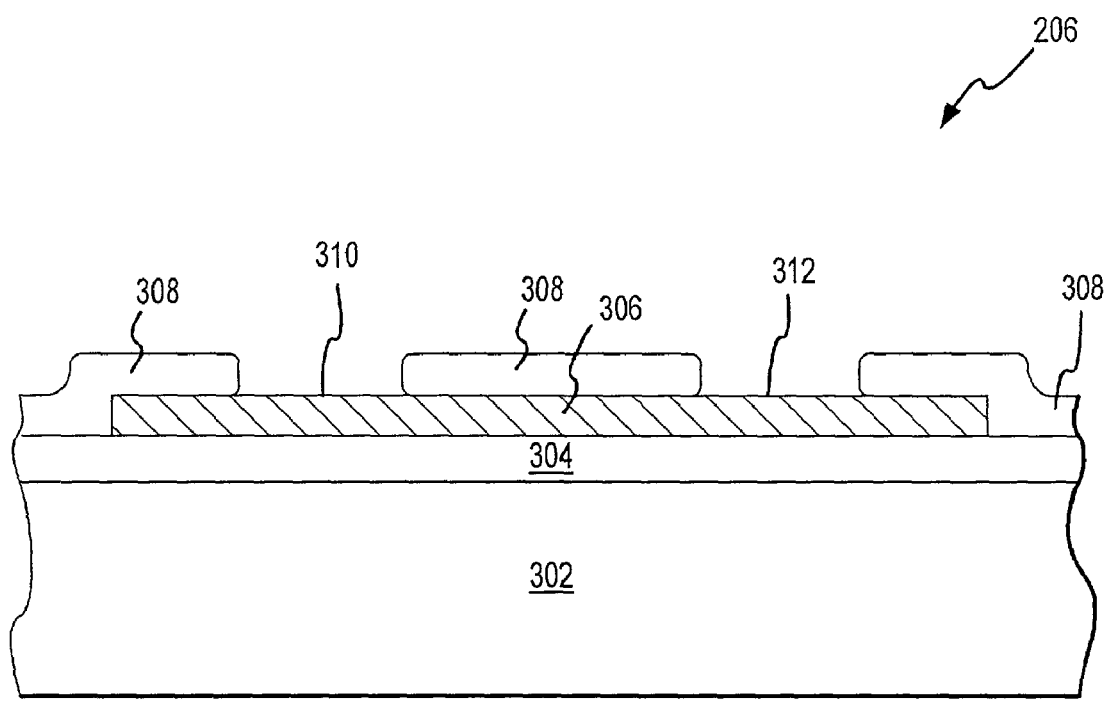
FIG. 3 is a schematic cross-sectional view of an interposer in accordance with one embodiment of the present invention.

Interposer 206 provides an intermediate level within the stack (i.e., between first semiconductor device 204 and second semiconductor device 208) to which wire bonds may be formed such that the manufacturability of the package may be improved. In general, a silicon interposer 206 in accordance with the present invention includes a number of bond pads connected by a set of conductive traces. More particularly, referring to FIG. 3, silicon interposer 206 in accordance with one embodiment of the present invention comprises an interposer substrate 302, a dielectric layer 304 formed on interposer substrate 302, a conductive trace 306 formed on dielectric layer 304, a passivation layer 308 having windows formed therein to allow contact to conductive trace 306, and bond pads 310 and 312, which are electrically coupled to underlying conductive trace 306. The positions of the bond pads on interposer 206 may be selected to minimize the occurrence of crossing and interleaved bond-wires. That is, inasmuch as the desired connectivity and bond-wire patterns for the stacked-die arrangement are known a priori, it is possible to configure the bond pads and conductive traces in such a way that crossing and interleaved bond-wires are eliminated or substantially reduced. This optimization may be carried out manually or via software code configured to produce the desired layout for interposer 206.

Figure 2:
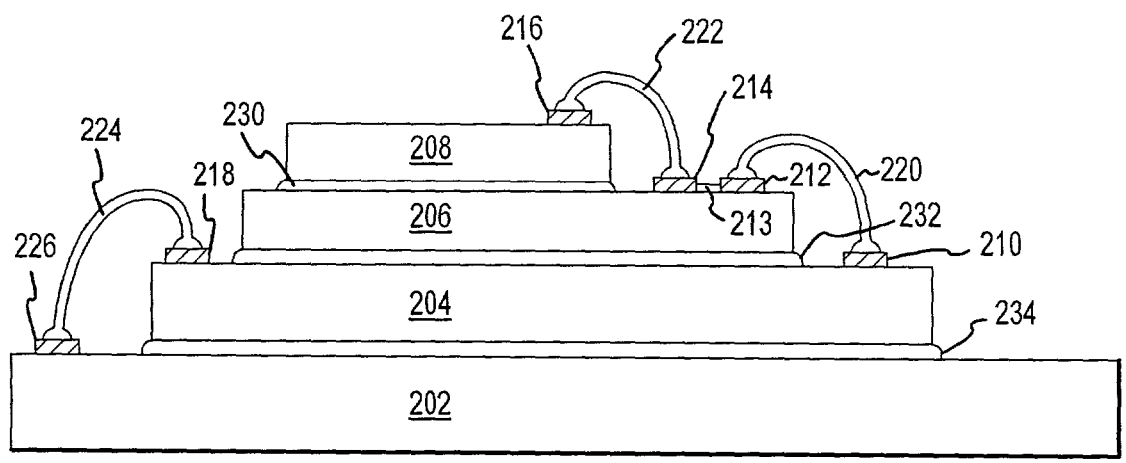
FIG. 2 is a schematic cross-sectional view of a stacked-die package incorporating an interposer in accordance with various aspects of the present invention.

Interposer substrate 302 may comprise any suitable material, such as any of the materials listed above in connection with layer 202 in FIG. 2. As it may be desirable to manufacture interposer 206 using materials and methods which are relatively inexpensive, one embodiment of interposer 206 uses silicon for interposer substrate 302, a standard oxide, nitride, borophosphosilicate glass (BPSG) or oxynitride for dielectric layer 304, aluminum, copper, or an alloy thereof for conductive trace 306, and a silicon nitride layer for passivation layer 308. Passivation layer 308 may also comprise an organic material such as BCB or polyimide. Alternatively, passivation layer 308 may not formed at all, e.g., in the instance where the interposer comprises an insulator such as ceramic or an organic material.

Formation of the conductive trace 306 and windows for bond pads 310 and 312 may be performed using any convenient technique, e.g., any of the various photolithographic techniques traditionally used in connection with silicon semiconductor devices. Furthermore, rather than form a conductive trace, it may be desirable in some applications to simply form a relatively large bond pad which can accommodate two or more wire bonds, thereby providing the connectivity required.

The thickness of interposer substrate 302 may be selected in accordance with the appropriate design goals. In one embodiment, interposer substrate 302 comprises a standard, moncrystalline silicon material which, in wafer form, has been back-lapped to between about 50-300 microns, preferably about 152 microns (6 mils). As mentioned above, interposer substrate 302 may comprise materials other than silicon, e.g., a ceramic or organic material.

Figure 4:
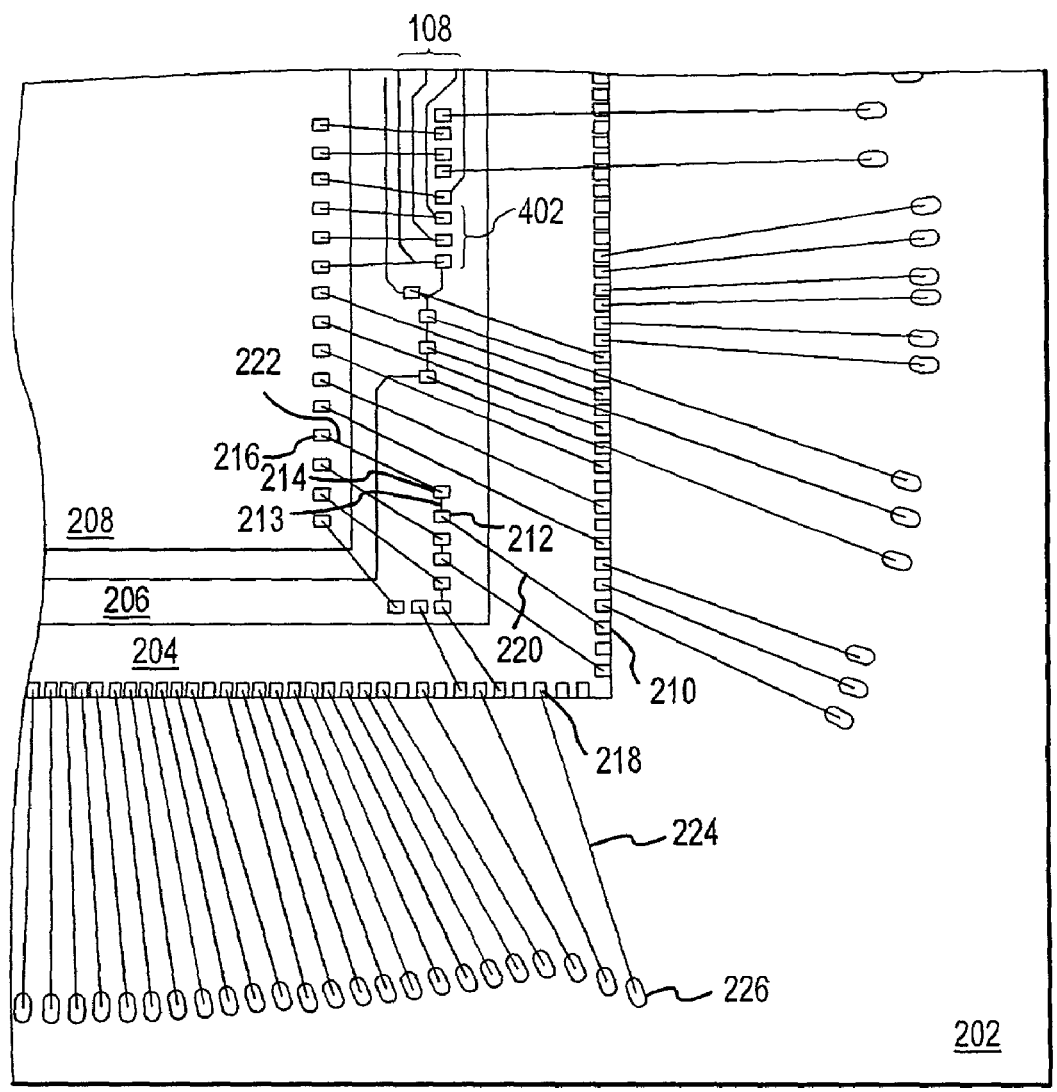
FIG. 4 is a schematic plan view of a stacked-die arrangement incorporating an interposer in accordance with one embodiment of the present invention.

FIG. 4 depicts a portion of a package implementing one embodiment of the present invention. As described previously, a stack consisting of second semiconductor device 208, interposer 206, and first semiconductor device 204 is mounted to package substrate 202. Interposer 206 includes a number of conductive traces (e.g., traces 404) and associated bond pads (e.g., bond pads 402). Bond wire 220 connects bond pad 210 on first semiconductor device 204 to bond pad 212 on interposer 206. Bond wire 222 connects bond pad 314 on interposer 206 to bond pad 216 on second semiconductor device 208. Interposer bond pads 214 and 212 are electrically coupled via a conductive race 213. Bond wire 224 connects bond pad 226 on package substrate 202 and bond pad 218 on first semiconductor device 204.

Referring again to FIG. 2, a method of fabricating the semiconductor package will now be described. Initially, a suitable package substrate 202 is provided. As mentioned above, package substrate 202 may comprise a variety of structures, e.g., a BGA substrate.

The first semiconductor device 204 is suitably bonded to package substrate 202 using a die bond 234, for example, an epoxy paste or adhesive tape as described above. This step typically involves applying the paste or tape material 234 on package substrate 202, then using a pick-and-place operation to position first semiconductor device 204 on die bond 234. Depending upon the material used for die bond 234, a curing step may also be required. Similarly, the surface of package substrate 202 may be prepared using an appropriate cleaning step.

Next, interposer 206 is bonded to the top of first semiconductor device 204 using a die bond 232. As mentioned above in connection with die bond 234, die bond 232 may also require a cleaning step and/or curing step. After interposer 206 is mounted, second semiconductor device 208 is bonded to the top of semiconductor 208 via die bond 230.

After the stacked die arrangement is formed (i.e., package substrate 202, first semiconductor device 204, interposer 206, and second semiconductor device 208), the various bond wires are provided between the bond pads within the stack—that is, bond wire 222 between bond pads 216 and 214, bond wire 220 between bond pad 212 and 210, and bond wire 224 between bond pad 226 and 218. Furthermore, it will be understood that any wirebonds (including stitch-bonds, etc.) may be formed between any combination of devices in the stack and the package substrate. For example, it is likely that a given device might include wire bonds extending from the topmost die to the package substrate. The order in which wirebonding takes place may be selected in accordance with the geometry of the stack and other design factors. As mentioned above, the bond wires may be formed using a variety of materials and any convenient bonding techniques, e.g., thermal-compression bonding.

Although the invention has been described herein in conjunction with the appended drawings, it will be appreciated that the scope of the invention is not so limited. For example, while the present invention has been described in connection with one interposer sandwiched between two semiconductor devices, the present invention may be used with any number of semiconductor devices and interposers, for example, a series of three semiconductor devices having two interposers provided therebetween. These and other modifications in the selection, design, and arrangement of the various components and steps discussed herein may be made without departing from the scope of the invention as set forth in the appended claims.

The invention claimed is:

1. A stacked die package comprising:
   a package substrate having a top side and a bottom side, the top side having a plurality of bond pads, and the bottom side having a ball-grid array pattern;
   a first semiconductor device mounted on the top side of the package substrate, the first semiconductor device having a plurality of bond pads;
   a silicon interposer mounted on the first semiconductor device, the interposer having a first interposer bond pad and a second interposer bond pad, wherein the first and second interposer bond pads are formed by a conductive trace, and wherein the interposer includes: an interposer substrate; a dielectric layer formed on the interposer substrate; the conductive trace formed on the dielectric layer; and a passivation layer formed on the conductive trace, the passivation layer having a plurality of windows to expose the conductive trace in areas defining the interposer bond pads;
   a second semiconductor device mounted on the interposer, the second semiconductor device having a plurality of bond pads; and
   a plurality of bond wires coupled between the bond pads of the package substrate, the first semiconductor device, the silicon interposer, and the second semiconductor device, wherein each of the plurality of bond wires is coupled between two adjacent layers of the stacked die package.

2. The stacked die package of claim 1, wherein the interposer substrate comprises silicon.

3. The stacked die package of claim 1, wherein the package substrate comprises a material selected from the group consisting of ceramic, polyimide, metal, glass-filled resin, and cyanate-glass.

4. The stacked die package of claim 1, wherein the package substrate includes multilevel metallization.

5. The stacked die package of claim 1, wherein the interposer passivation layer comprises silicon nitride.

6. A stacked die package comprising:
a substrate layer having a plurality of bond pads;
a first semiconductor layer having a plurality of bond pads, the first semiconductor layer mounted on the substrate layer;
a silicon interposer layer mounted on the first semiconductor layer, the interposer layer having a first bond pad and a second bond pad formed by a conductive trace extending at least partly within the interposer layer; and
a second semiconductor layer mounted on the silicon interposer layer, the second semiconductor layer having a plurality of bond pads.

7. The stacked die package of claim 6, comprising a plurality of bond wires each coupled between a bond pad of one layer and a bond pad of an adjacent layer.

8. The stacked die package of claim 6, wherein the silicon interposer layer comprises a substrate, a dielectric layer formed on the substrate, the conductive trace formed on the dielectric layer, and a passivation layer formed on the conductive trace, the passivation layer having a plurality of openings configured to expose the conductive trace and to form the first and second bond pads.

9. A die package comprising:
a substrate;
a first semiconductor mounted on the substrate;
a silicon interposer mounted on the first semiconductor device;
a second semiconductor mounted on the silicon interposer wherein the substrate, the first and second semiconductors, and the silicon interposer each comprise a plurality of bond pads; and
a plurality of bond wires each coupled between a bond pad of one layer and a bond pad of an adjacent layer.

10. The die package of claim 9, wherein the silicon interposer comprises a plurality of conductive traces extending through the interposer, each conductive trace configured to form a first and a second bond pad and to electrically couple the first and second bond pads together.

11. The die package of claim 9, wherein the silicon interposer comprises a plurality of conductive traces on the surface of the interposer, each conductive trace configured to electrically couple the first and second bond pads together.

* * * * *